(12) United States Patent
Keller et al.

(10) Patent No.: US 6,261,931 B1
(45) Date of Patent: Jul. 17, 2001

(54) HIGH QUALITY, SEMI-INSULATING GALLIUM NITRIDE AND METHOD AND SYSTEM FOR FORMING SAME

(75) Inventors: Stacia Keller; Bernd Peter Keller, both of Goleta; Umesh Kumar Mishra, Santa Barbara; Steven P. DenBaars, Goleta, all of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/100,921

(22) Filed: Jun. 19, 1998

Related U.S. Application Data

(60) Provisional application No. 60/050,367, filed on Jun. 20, 1997.

(51) Int. Cl.[7] .............................. H01L 21/20; H01L 21/36
(52) U.S. Cl. ..................... 438/492; 438/492; 438/590; 438/681; 438/758; 438/763; 438/767; 438/797
(58) Field of Search ..................... 438/492, 758–799, 438/590, 681

(56) References Cited

U.S. PATENT DOCUMENTS

| | | |
|---|---|---|
| 4,153,905 | 5/1979 | Charmakadze et al. . |
| 4,990,972 | 2/1991 | Satoh et al. . |
| 5,272,108 * | 12/1993 | Kozawa ................................ 437/127 |
| 5,369,289 * | 11/1994 | Tamaki et al. .......................... 57/99 |
| 5,455,429 | 10/1995 | Paoli et al. . |
| 5,574,745 | 11/1996 | Paoli et al. . |
| 5,583,880 | 12/1996 | Shakuda . |
| 5,602,418 | 2/1997 | Imai et al. . |
| 5,608,753 | 3/1997 | Paoli et al. . |
| 5,650,198 * | 7/1997 | Denbaars et al. ................. 427/255.2 |

OTHER PUBLICATIONS

Ruvimov et al. Mechanisms of generation and Atomic Structure of defects . . . IEEE –0–7803–4354–9/99.*
S. M. Sze, VLSI Technology 2nd ed. 1988 McGraw Hill p. 19.*

* cited by examiner

Primary Examiner—Matthew Smith
Assistant Examiner—Granvill D. Lee
(74) Attorney, Agent, or Firm—Gates & Cooper LLP

(57) ABSTRACT

A method for growing high-quality gallium nitride over a substrate is disclosed. The method comprises growing first layer with a high dislocation density over the substrate, a second layer having a high number of point defects and a reduced dislocation density as compared to the dislocation density of the first layer over the first layer, and a third layer having a reduced number of point defects as compared to the second layer over the second layer. The resulting gallium nitride is semi-insulating, which inhibits parasitic current flow and parasitic capacitive effects, yet it not so insulating that electron flow in adjacent transistor channels is inhibited.

23 Claims, 4 Drawing Sheets

HIGH QUALITY, SEMI-INSULATING GALLIUM NITRIDE AND METHOD AND SYSTEM FOR FORMING SAME

CROSS-REFERENCE TO RELATED APPLICATIONS

Embodiments of this invention relate to Provisional Application Ser. No. 60/050,367, filed Jun. 20, 1997. The contents of that application are incorporated by reference herein.

GOVERNMENT RIGHTS

This invention was made with Government support under Grant No. N00014-96-1-1215, awarded by the Office of Naval Reseatch and Grant No. F49620-96-1-0398, awarded by the Air Force. The government has certain rights in this invention.

BACKGROUND OF THE INVENTION

1. Field of the Invention

Embodiments of this invention relate generally to gallium nitride (GaN) films, and in particular embodiments to methods for for forming high quality, semi-insulating GaN for reducing parasitic conductivity and parasitic capacitance in electronic devices, and systems incorporating the same.

2. Description of Related Art

In the fabrication of semiconductor devices such as light emitting diodes (LEDs), lasers, or field-effect transistors (FETs) there is often a need to create semiconducting layers with different physical and electrical properties to produce desired device performance. In FETs, for example, the transistor must be built upon a material with electrically insulative properties. Referring to FIG. 1, a FET 10 operates by having electrons 12 flow from one electrode (a "source" 14) to another (a "drain" 16), creating current flow 18 through the FET 10, where the current flow 18 is modulated by third electrode (a "gate" 20). The electrons 18 flowing from source 14 to drain 16 should ideally travel in a channel 22 close to the gate 20 to allow the gate 20 to control the current flow 18. Thus, it is undesirable for electrons 12 to flow from source 14 to drain 16 in an arcing path 24 that travels a great distance from the gate 20, or from source 14 along a parasitic path 26 to an entirely different location such as a ground 28, because control over the electrons 12 is lost. For proper functioning of a FET 10, the channel 22 must therefore be insulated to block these parasitic current flows.

Thus, a semi-insulating layer 30 (a layer that does not normally conduct current) is typically fabricated below the channel 22 to keep electrons 12 in the channel 22 and prevent them from taking paths 24 or 26. Semi-insulating material blocks the flow of current through the material and is used in transistors where current must be allowed to flow in the channel, but not in the layer beneath it.

High-frequency operation is another reason for utilizing a semi-insulating underlayer 30. In many present-day applications, transistors must operate at high frequencies. High frequency operation is dependent on minimizing the resistance R and capacitance C between circuit nodes and ground, because the larger the product of R and C (the "RC time constant"), the lower the frequency of possible circuit operation. There are two types of capacitance present on the gate 20 of FET 10. A capacitance identified herein as a gate capacitance 32 exists between the gate 20 and the current-carrying electrons 12. This gate capacitance 32 is necessary to modulate the current flow 18 under the gate 20 in the FET 10. However, there is also a parasitic capacitance 34 that exists between the gate 20 and ground 28 through a resistive path 36. The parasitic capacitance 34 should be minimized, because the RC time constant produced by the charging and discharging of the parasitic capacitance 34 through resistive path 36 slows down the operation of the gate 20 and FET 10 and also wastes power. Because of its insulating properties, the semi-insulating layer 30 prevents undesirable parasitic capacitance 34 from being generated on the gate 20.

In certain applications, gallium arsenide (GaAs) and Indium phosphide (InP) have been used for semiconductor devices. GaAs and InP are typically grown as epitaxial layers over substrates of the same material (i.e., GaAs semi-insulating material is grown on available GaAs substrates, and InP semi-insulating material is grown on available InP). The growth of semi-insulating GaAs and InP on like substrates is preferable because crystal growth is simplified by the identical crystalline structure of the substrate and the material being grown.

In other applications such as the fabrication of high power or optoelectronic devices active in the ultraviolet (UV) to blue region of the electromagnetic spectrum, however, the properties of gallium nitride (GaN) make it preferable to GaAs or InP. Unfortunately, GaN substrates are not readily available, because it is very difficult to make GaN in bulk form.

Lacking a practical method of making bulk GaN upon which to grow semi-insulating GaN, sapphire or silicon carbide has often been selected as a substitute substrate material because of its similar terminal properties to GaN (very hard, high melting temperature), with sapphire being the predominant choice. However, growing GaN on a sapphire substrate is difficult, with its own set of unique problems and technology requirements that are not readily transferable from the fabrication processes of other semi-insulating materials.

The bonding of two dissimilar materials such as sapphire and GaN is made difficult because of their different crystalline structures. As illustrated symbolically in FIG. 2a, GaN molecules 38 to be grown on a sapphire substrate 54 may first bond with each other to form a crystal 46. When GaN molecules 38 bond together, the spacing of bonding atoms 42 (represented by dots in the corners of GaN molecules 38) will align due to their identical atomic structures, and bonding is achieved without deformation of the GaN crystal 46.

However, GaN molecules 38 must also bond with sapphire molecules 40 of the sapphire substrate 54 if a GaN layer is to be grown. Unfortunately, when a GaN molecule 38 attempts to bond with sapphire 40, the gallium and nitrogen atoms 42 are not spaced in congruence with the aluminum and oxygen atoms 44 of the substrate (represented by dots in the corners of sapphire 40). Notwithstanding this mismatch, because the atomic spacing of the GaN lattice and the atomic spacing of the sapphire lattice is not too dissimilar, the GaN crystal 46 will deform to complete the bond. FIG. 2b illustrates a deformed GaN crystal 46 bonded with the sapphire substrate 54, with the squeezed and stretched profiles of the GaN molecules 38 symbolically representing the stressed crystal structure. If this stress is large enough, the lattice of the GaN crystal 46 will start to tear. FIG. 2b illustrates a torn GaN crystal 46 bonded with the sapphire substrate 54. The tear in the GaN crystal 46 is known as a dislocation 52.

Conventionally grown GaN on the surface of the sapphire substrate will have on the order of $10^{10}$ dislocations per cm$^2$.

Because dislocations create defects of acceptor character which tend to absorb free electrons, this initial layer of GaN may be heavily insulating. Conventional techniques for growing GaN subsequently reduce the number of dislocations roughly an order of magnitude by during growth of the remainder of the GaN layer. If the growth of the remainder of the GaN layer is performed at reduced pressure (approximately 0.1 atm), the resultant GaN is semi-insulating not only because of the remaining dislocations, but also because carbon impurities introduced into the GaN during the growth process create point defects of acceptor character. Point defects near the surface of the GaN are undesirable if the GaN is used as an insulating layer for a FET, because they will capture electrons and inhibit the flow of current in the adjacent FET channel and will reduce the electron mobility in the channel.

High quality semi-insulating GaN, as defined herein, is characterized by high structural quality of the GaN (a relatively low number of dislocations) and high electronic quality at the atomic level (a low number of point defects). Conventional techniques therefore produce semi-insulating GaN of acceptable structural quality due to the reduction of dislocations during growth of the second layer, but of poor electronic quality due to the high concentrations of point defects generated during growth of the second layer.

SUMMARY OF THE DISCLOSURE

Therefore, it is an object of embodiments of the invention to provide a method for growing semi-insulating GaN of acceptable structural quality and high electronic quality.

It is a further object of embodiments of the invention to produce a material suitable for use as a semi-insulating underlayer for transistors wherein the material will inhibit parasitic current flow, yet allow the flow of electrons in transistor channels adjacent to the semi-insulating GaN.

These and other objects are accomplished according to a method for growing gallium nitride over a substrate. The method comprises growing first layer with a high dislocation density over the substrate, a second layer having a high number of point defects and a reduced dislocation density as compared to the dislocation density of the first layer over the first layer, and a third layer having a reduced number of point defects as compared to the second layer over the second layer. In preferred embodiments of the present invention, the first layer is grown at approximately one atmosphere and 400–600° C., the second layer is grown at approximately 0.1 atmosphere and 1040° C., and the third layer is grown at approximately one atmosphere and 1050° C.

These and other objects, features, and advantages of embodiments of the invention will be apparent to those skilled in the art from the following detailed description of embodiments of the invention, when read with the drawings and appended claims.

DETAILED DESCRIPTION OF PREFERRED EMBODIMENTS

In the following description of preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the preferred embodiments of the present invention.

Figure 1:
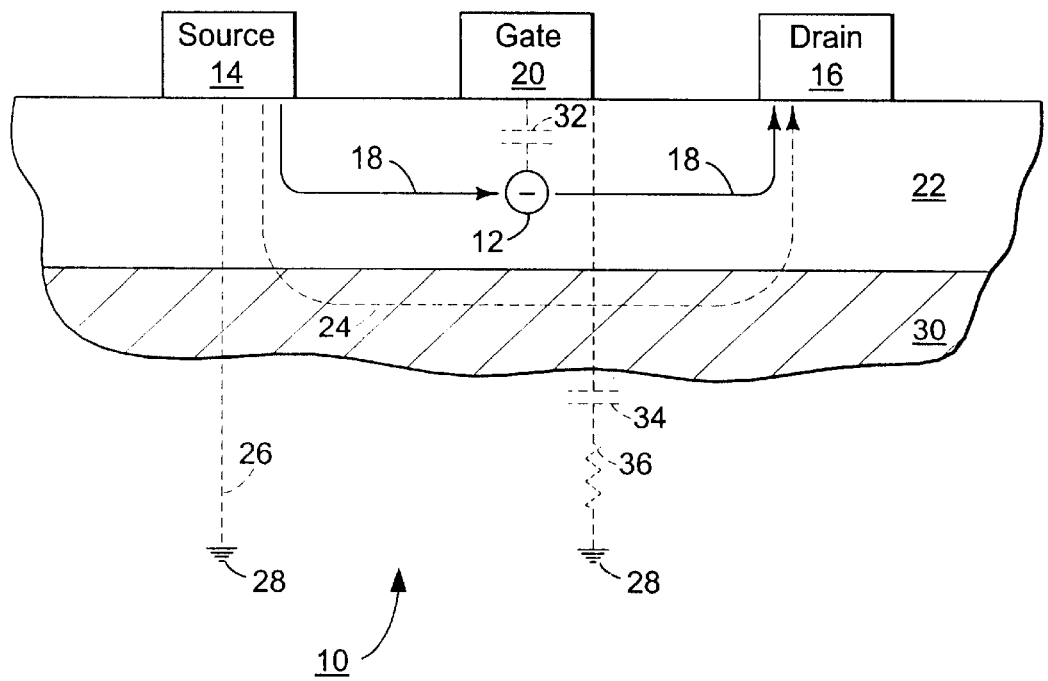
FIG. 1 is a drawing of a conventional FET with a semi-insulating underlayer.

In the fabrication of semiconductor devices such as light emitting diodes (LEDs), lasers, or field-effect transistors (FETs) there is often a need to create layers with different physical and electrical properties to produce desired device performance. In the FET 10 of FIG. 1, for example, the transistor must be built upon a material with electrically insulative properties. Electrons 12 flowing from source 14 to drain 16 should ideally travel in a channel 22 close to the gate 20 to allow the gate 20 to control the current flow 18. Thus, it is undesirable for electrons 12 to flow in parasitic current paths 26, 24 from the source to ground or from source to drain along a path that travels a great distance from the gate. For proper functioning of a FET 10, the channel 22 should be insulated to block these parasitic current flows and avoid parasitic capacitance effects.

Semi-insulating material 30 is typically utilized below the channel 22 to limit these parasitic current and capacitive effects. Semi-insulating material 30 blocks the flow of current through the material, and is used in transistors where current 18 must be allowed to flow in the channel 22, but not in the layer beneath it.

In applications such as the fabrication of high power or optoelectronic devices active in the ultraviolet (UV) to blue region of the electromagnetic spectrum, Gallium Nitride (GaN) is preferred over group III arsenide and phosphide semiconductors. However, GaN substrates are not readily available, because it is very difficult to make GaN in bulk form. Lacking a practical method of making bulk GaN upon which to grow semi-insulating GaN, sapphire has often been selected as a substitute substrate material because of its similar terminal properties to GaN (very hard, high melting temperature). In alternate embodiments of the present invention, other substrates such as silicon, silicon carbide, magnesium oxide, lithium gallate, or spinel may also be used.

Conventional techniques for growing semi-insulating GaN involve depositing a first layer over the sapphire substrate, then growing the remainder of the GaN at low pressure to produce semi-insulating GaN with dislocations and point defects of acceptor character (e.g., carbon impurities and native defects with acceptor character). The resultant GaN is semi-insulating not only because of the dislocations, but also because carbon impurities and other point defects introduced into the GaN during the growth process create point defects of acceptor character. These point defects are undesirable in that they lower the charge and/or electron mobility in adjacent transistor channels.

Figure 3:
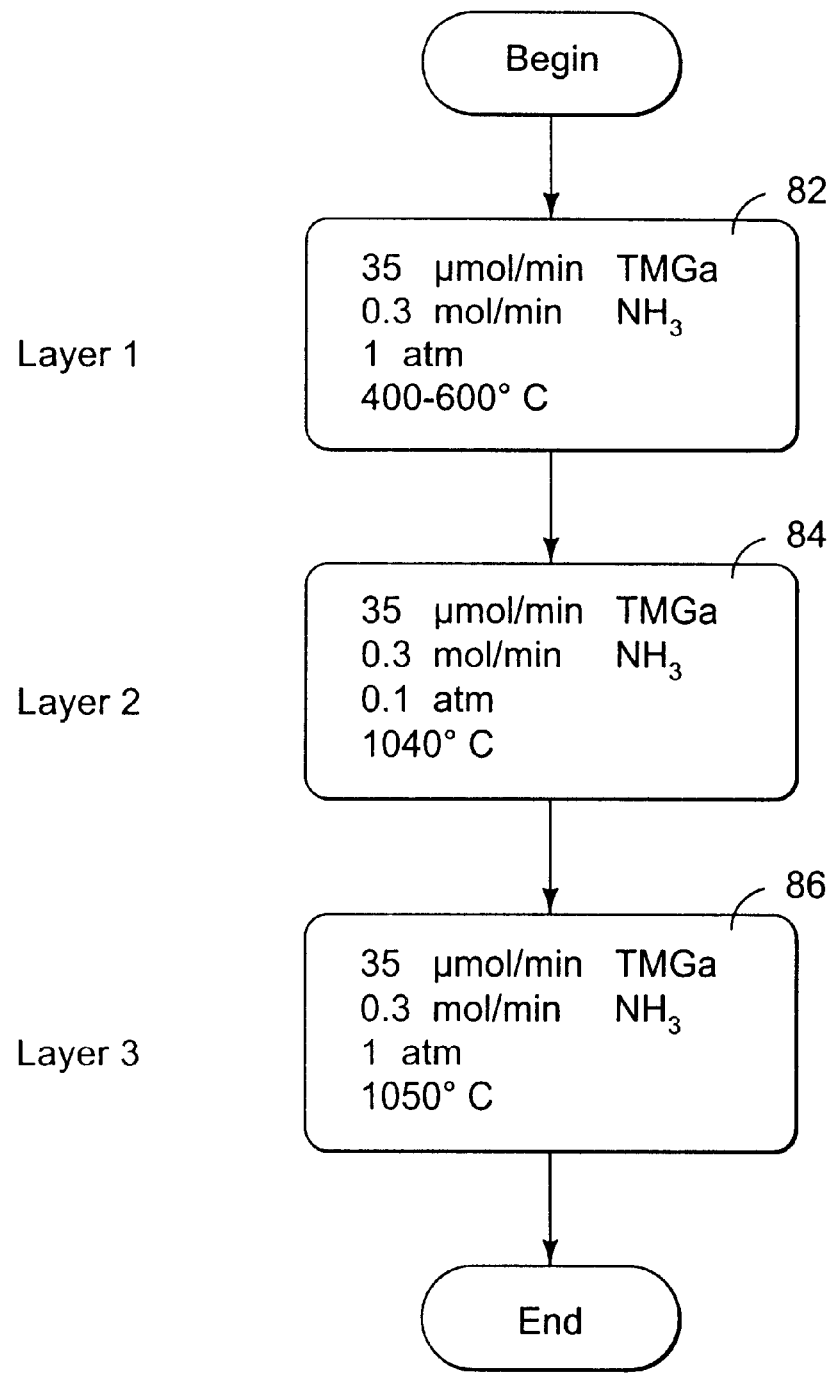
FIG. 3 is a flowchart of a method from growing high quality, semi-insulating GaN according to an embodiment of the present invention.

As illustrated in the flowchart of FIG. 3, embodiments of the present invention involve forming a total of three layers of GaN, each under different growth conditions. Briefly summarized, the first layer is a nucleation layer formed at low temperature and high pressure (see block 82) whose primary function is adherence to the sapphire substrate. The second layer is formed at high temperature and low pressure (see block 84) and establishes a reduced dislocation density. A third layer is then formed at high temperature and high pressure (see block 86) to produce semi-insulating GaN with low numbers of carbon impurities and other defects of acceptor character to avoid electron loss and degradation of the electron mobility.

Figure 4:
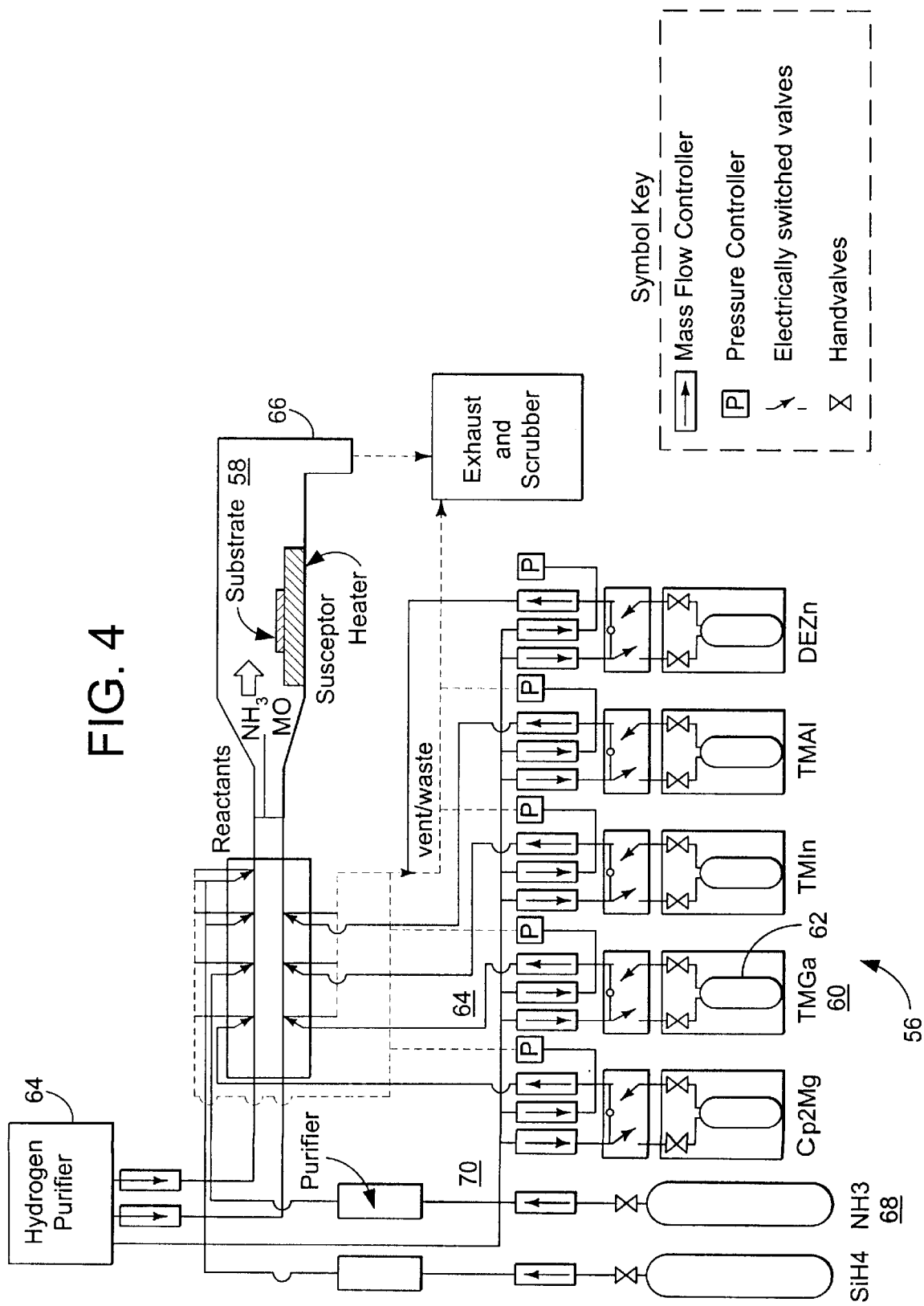
FIG. 4 is a schematic diagram of a GaN MOCVD system used in embodiments of the present invention.

In preferred embodiments of the present invention, the GaN is formed using a Metal Organic Chemical Vapor Deposition (MOCVD) system 56, illustrated schematically in FIG. 4. In embodiments of the present invention, the sapphire substrate 58 is first baked at approximately 1080° C. to remove impurities. To deposit Ga and N on the sapphire substrate 58, trimethylgallium (TMGa) 60, a metalorganic compound represented molecularly as Ga(CH$_3$)3 (v), is used as a starting precursor. TMGa is stored as a liquid in a stainless steel container 62, and hydrogen gas 64 is bubbled through the TMGa liquid 60. Some of the TMGa saturates according to the vapor pressure of TMGa in hydrogen, and the saturated TMGa molecules are carried along in the hydrogen stream 64. The gas is then fed into a reactor 66, along with ammonia gas (NH$_3$) 68 fed through a stainless steel tube 70 and additional hydrogen gas 64 to ensure an adequate flow profile and hydrodynamics. The molecules fly above the sapphire substrate 58 which is heated to temperatures from 400–1150° C., causing the molecules to decompose on the heated substrate and form GaN, a solid. The heated substrate is necessary to cleave the bonds of the TMGa and NH$_3$. Methane gas (3CH$_4$) is also produced and is removed from the reactor. Thus, the basic MOCVD reaction during the GaN deposition process can be expressed as:

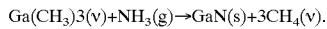

$$Ga(CH_3)3(v)+NH_3(g) \rightarrow GaN(s)+3CH_4(v).$$

The exact concentrations of the reactants are dependent on the reactor 66 and how it operates. However, in preferred embodiments of the present invention, the molar flow will be approximately 35 umol/min for TMGa and approximately 0.3 mol/min for NH$_3$, with a total gas flow through the reactor 66, including the extra hydrogen, of approximately 10 liters/min. The pressure and temperature of the reactor will vary depending on which of the three layers is being grown (as indicated in FIG. 3), and will be discussed in detail in the paragraphs that follow.

In alternate embodiments of the present invention, molecular beam epitaxy (MBE) or hydride vapor phase epitaxy (HVPE) may also be used to form the GaN layers. In these alternate embodiments, starting precursors other than TMGa may be used. For example, in MBE, a high vacuum is required, and gallium and nitrogen sources supply atomic gallium and nitrogen into the reactor. In HVPE, hydride, ammonia, and gallium chloride are used as precursors. The common result of these alternate embodiments is the supplying of gallium and nitrogen atoms for deposition on the substrate surface. Although in preferred embodiments of the present invention NH$_3$ is used to supply the nitrogen atoms because it is the purest nitrogen compound, in alternate embodiments of the present invention other compounds may also be used to supply the nitrogen, such as compounds of the type R$_3$N with R=H, methyl, tertiarybutyl, or other C$_x$H$_y$ groups or halogen atoms.

Figure 5:
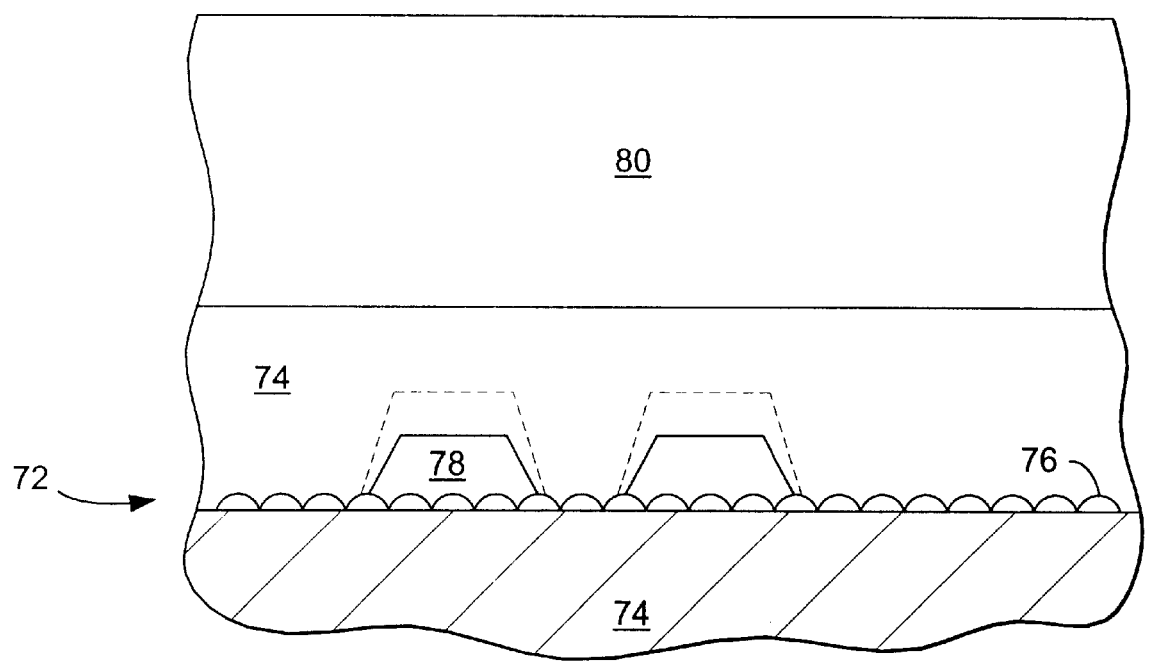
FIG. 5 is a cross-sectional view of three layers of GaN grown on a sapphire substrate according to an embodiment of the present invention.

In embodiments of the present invention, the first step in the GaN MOCVD process is to grow a thin first layer of GaN 72 over a sapphire substrate 74 as shown in FIG. 5 and described in block 82 of FIG. 3. In conventional epitaxy (the process of growing modified layers of top of a crystal substrate), the layers being grown are usually of the same type as the crystal substrate. For the growth of GaN, however, GaN substrates are not readily available. Sapphire is a preferred substitute substrate because its terminal properties are comparable to GaN (very hard, high melting temperature). However, the atomic positions of the aluminum and oxygen atoms in the sapphire lattice on the surface of the substrate do not align with the atomic positions of the gallium and nitrogen atoms being deposited on the substrate. This mismatch of dissimilar materials creates problems in the bonding of the two materials.

Because of these bonding difficulties, the first layer of deposited GaN 72 can be analogized to primer used prior to painting, a layer needed to make the other layers stick. Once the sapphire substrate 74 is covered with a first layer of GaN 72, subsequent layers will not experience the difficulty of bonding with the dissimilar sapphire 74 below—all they encounter is the bottom layer of GaN 72.

Figures 2A, 2B:
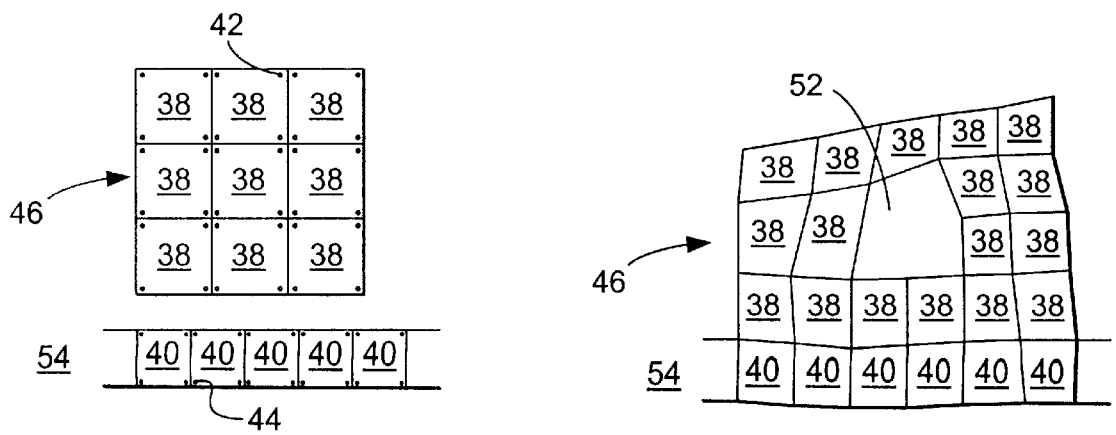
FIG. 2a is a symbolic representation of a GaN crystal to be bonded to a sapphire substrate.
FIG. 2b is a symbolic representation of a GaN crystal bonded to a sapphire substrate according to a conventional epitaxy process.

However, even the first "primer" layer of GaN 72 will experience difficulties in bonding with the sapphire substrate 74 because of their different crystalline structures. As previously discussed and illustrated symbolically in FIG. 2b, GaN crystals bonded to the sapphire will contain a high number of dislocations 52 in densities on the order of 10$^{10}$ dislocations per cm$^2$.

Two types of dislocations are actually created in the formation of the first GaN layer 72. One type is called an edge dislocation, and the other is called a mixed dislocation. Mixed dislocations can create defects with acceptor character. Thus, GaN with mixed dislocations will have a tendency to accept electrons, which impedes the flow of electrons through the GaN and makes the GaN insulative.

Referring again to FIG. 5, although these dislocations represent structural defects in the first GaN layer 72, the dislocations are not of consequence due to the first layer's primary function as a primer or wetting layer. What is essential, however, is that the first layer 72 completely cover the sapphire substrate 74, a result that is temperature dependent. When the MOCVD process deposits Ga and N on the surface of the sapphire substrate 74, these atoms stick and form small nuclei 76. If the temperature of the reactor chamber is high (approximately 1050° C.), the GaN molecules become mobile and there is a high probability that the GaN nuclei will merge and form larger independent islands and columns on the sapphire (a "ripening" process) rather than form a thin, closed film over the sapphire. Thus, to prevent the formation of large independent columns, in preferred embodiments of the present invention the first layer 72 is grown at low temperature (approximately 400–600° C.) so that the GaN molecules are not given enough energy to migrate and merge, and a thin layer of GaN (approximately 20 nanometers) is formed. In preferred embodiments of the present invention, the first layer 72 is also grown at atmospheric pressure (approximately 1 atm), but in alternate embodiments of the present invention low pressure (approximately 0.1 atm) may also be used. The thin nucleation layer 72 that forms is structurally poor, and contains many defects, stacking faults, and dislocations, but it as long as it completely covers the substrate (complete wetting), it will serve its purpose as a primer.

In embodiments of the present invention, the second step in the GaN MOCVD process is to grow a second layer of GaN 74 over the first layer 72 under different growth conditions, as illustrated in FIG. 5 and described in block 84 of FIG. 3. The second layer 74 can be analogized to another primer layer whose function is to reduce the number of dislocations (dislocation density) that will be seen by the third layer.

As mentioned above, the number of dislocations in the first layer 72 number is on the order of $10^{10}$ dislocations per $cm^2$. If GaN with these quantities of dislocations were placed adjacent to the channel of a FET, for example, the mobility of electrons in the channel would be significantly reduced. Therefore, in embodiments of the present invention the purpose of the second layer 74 is to reduce the number of dislocations to allow acceptable electron mobility in the channel above the GaN, yet still maintain the insulative properties of the GaN.

To grow the second layer of GaN 74, in preferred embodiments of the present invention the temperature is raised to approximately 1040° C., and low pressure (0.1 atm) is established. At this temperature, newly deposited GaN molecules now have enough energy to become mobile on the surface of the first layer of GaN. With such mobility, GaN molecules merge or ripen into larger islands 78 (because of the desire in nature to have the largest volume with the least surface area), eventually forming independent islands of GaN 72.

The island formation during growth of the second layer 78 is dependent on the quantities of Ga and N present on the surface. These quantities can be changed by adjusting the pressure of the reactor or the input flow of ammonia. Low input flow of ammonia gas, for example, will tend to grow insulating material. The quantities of gallium and nitrogen atoms also affects the chances of impurity incorporation. For example, if there are already a lot of nitrogen atoms on the surface of the first layer 72 then there is little chance for a carbon impurity atoms to stick.

Eventually, the islands 78 of GaN will grow together and merge, forming a solid second layer 74 with a thickness, in preferred embodiments of the present invention, of approximately 20–500 nanometers. As islands merge, some of their dislocations will meet and annihilate or cancel out each other. Thus, in preferred embodiments of the present invention, by the completion of the growth of the second layer the number of dislocations will have been reduced roughly an order of magnitude, to approximately $10^9$ dislocations per $cm^2$.

However, during this growth at low pressure the chemical bonds of TMGa are not cleaved efficiently, resulting in high carbon impurity incorporation into the second layer of GaN 74. These point defects are of acceptor character as carbon (with 4 valence electrons) displaces nitrogen (with 5 valence electrons) in the GaN crystals. In addition other point defects with acceptor character such as the native defect VGa may be formed. Point defects near the surface of the GaN are undesirable if the GaN is used as an insulating layer for a FET, because they will capture electrons and inhibit the flow of current in the adjacent FET channel and will reduce the electron mobility in the channel.

Conventional techniques for growing semi-insulating GaN stop after growing a second layer. The second layer has a reduced number of dislocations as compared to the first layer, but contains a high number of point defects of acceptor character which will tend to impede the flow of electrons in adjacent transistor channels and reduce the electron mobility in that channel.

In embodiments of the present invention, the third step in the GaN MOCVD process is to grow a third layer of GaN 80 over the second layer 74 under different environmental conditions, as illustrated in FIG. 5 and described in block 86 of FIG. 3. The purpose of the third layer 80 is to reduce the number of point defects of acceptor character and produce a semi-insulating material that will allow high electron mobility in an adjacent channel.

In embodiments of the present invention, the third layer 80 is grown up to a thickness of approximately 10 microns at high pressure (1 atm). During the growth of the third layer 80, the dislocation density does not change dramatically from the dislocation density of the second layer 74 (only approximately a factor of 2 or 3). However, the high pressure used in growing the third layer 80 produces a very low impurity incorporation due to the more efficient cleavage of the $Ga(CH_3)$ bonds, resulting in pure GaN and high electron mobility in adjacent channel material.

This third layer 80 has a comparable number of dislocations as compared to the second layer 74, which maintains the semi-insulating nature of the GaN, but contains many fewer point defects of acceptor character than the second layer 74, leaving the flow of electrons in adjacent transistor channels relatively unaffected and allowing high electron mobility in that channel.

Therefore, according to the foregoing description, preferred embodiments of the present invention provide a method for growing semi-insulating GaN of acceptable structural quality and high electronic quality. In addition, embodiments of the invention produce a material suitable for use as a semi-insulating underlayer for transistors wherein the material will inhibit parasitic current flow as well as parasitic capacitive effects, yet allow the flow of electrons in transistor channels adjacent to the semi-insulating GaN. It should be noted that embodiments of the present invention may be used to grow not only GlN, but its alloys with Boron, Aluminum, Indium, Arsenic, Phosphorus, and Antimony.

The foregoing description of preferred embodiments of the invention has been presented for the purposes of illustration and description. It is not intended to be exhaustive or to limit the invention to the precise form disclosed. It is intended that the scope of the invention be limited not by this detailed description, but rather by the claims appended hereto.

What is claimed is:

1. A method for forming gallium nitride over a substrate, the method comprising:

forming a first layer of gallium nitride with a first dislocation density over the substrate;

forming a second layer of gallium nitride having a first number of point defects and a reduced dislocation density as compared to the first dislocation density of the first layer over the first layer; and forming a third layer of gallium nitride having a reduced number of point defects as compared to first number of point defects of the second layer over the second layer.

2. The method of claim 1, wherein the step of growing a first layer further comprises the step of:

growing the first layer at approximately one atmosphere and approximately 400–600 degrees Celsius.

3. The method of claim 1, wherein the step of growing a second layer further comprises the step of:

growing the second layer at approximately 0.1 atmosphere and approximately 1040 degrees Celsius.

4. The method of claim 1, wherein the step of growing a third layer further comprises the step of:

growing the third layer at approximately one atmosphere and approximately 1050 degrees Celsius.

5. The method of claim 1, wherein the growing of gallium nitride is accomplished by metal organic chemical vapor deposition.

6. The method of claim 1, further including the step of using trimethylgallium with a molar flow of approximately 35 micromol/min as a starting precursor to deposit gallium on the substrate.

7. The method of claim 1, further including the step of using ammonia with a molar flow of approximately 0.3 mol/min to deposit nitrogen on the substrate.

8. A multi-layer stack of gallium nitride deposited over a substrate for insulating channels in semiconductor devices, comprising:
- a first layer of gallium nitride having a high dislocation density deposited over the substrate;
- a second layer of gallium nitride having a high number of point defects and a reduced dislocation density as compared to the dislocation density of the first layer deposited over the first layer; and
- third layer of gallium nitride having a reduced number of point defects as compared to the second layer deposited over the second layer.

9. The multi-layer stack of gallium nitride of claim 8, wherein the first dislocation density is on the order of $10^{10}$ dislocations per $cm^2$.

10. The multi-layer stack of gallium nitride of claim 8, wherein the first layer comprises a thin layer of gallium nitride nuclei that substantially covers the substrate.

11. The multi-layer stack of gallium nitride of claim 8, wherein the second layer has a dislocation density of approximately $10^9$ dislocations per $cm^2$.

12. The multi-layer stack of gallium nitride of claim 8, wherein the second layer comprises dislocations that have merged and annihilated each other.

13. The multi-layer stack of gallium nitride of claim 8, wherein the point defects in the third layer are of acceptor character.

14. The multi-layer stack of gallium nitride of claim 8, wherein the point defects in the third layer are created by carbon impurities and native defects.

15. The multi-layer stack of gallium nitride of claim 8, wherein the substrate is comprised of sapphire.

16. A system for growing gallium nitride over a substrate, the system comprising:
- a source of gallium for depositing gallium over the substrate;
- a source of nitrogen for depositing nitrogen over the substrate; and
- a reactor for growing gallium nitride on the substrate under specified environmental conditions;
- wherein the reactor includes at least one reaction chamber having means for controlling environmental conditions within the reactor to grow a first layer having a first dislocation density over the substrate, a second layer having a first number of point defects and a reduced dislocation density as compared to the first dislocation density of the first layer over the first layer, and a third layer having a reduced number of point defects as compared to the first number of point defects of the second layer over the second layer.

17. The system of claim 16, wherein the means for controlling environmental conditions further includes means for growing a first layer by setting the environmental conditions of the reactor to approximately one atmosphere and approximately 400–600 degrees Celsius.

18. The system of claim 16, wherein the means for controlling environmental conditions further includes means for growing a second layer by setting the environmental conditions of the reactor to approximately 0.1 atmosphere and approximately 1040 degrees Celsius.

19. The system of claim 16, wherein the means for controlling environmental conditions further includes means for growing a third layer by setting the environmental conditions of the reactor to approximately one atmosphere and approximately 1050 degrees Celsius.

20. The system of claim 16, wherein the growing of gallium nitride is accomplished by metal organic chemical vapor deposition.

21. The system of claim 16, wherein the source of gallium is trimethylgallium with a molar flow of approximately 35 micromol/min.

22. The system of claim 16, wherein the source of nitrogen is ammonia with a molar flow of approximately 0.3 mol/min.

23. The system of claim 16, wherein the substrate is comprised of sapphire.

* * * * *